(12) United States Patent
Yanagida et al.

(10) Patent No.: US 7,122,163 B2
(45) Date of Patent: Oct. 17, 2006

(54) RARE-EARTH OXIDE OR SULFIDE OF NANO SIZE AND PROCESS FOR PRODUCING THE SAME THROUGH PHOTOCHEMICAL REACTION

(75) Inventors: Shozo Yanagida, Hyogo (JP); Yuji Wada, Osaka (JP); Yasuchika Hasegawa, Osaka (JP)

(73) Assignee: Japan Science and Technology Agency, Saitama (JP)

(*) Notice: Subject to any disclaimer, the term of this patent is extended or adjusted under 35 U.S.C. 154(b) by 542 days.

(21) Appl. No.: 10/297,724

(22) PCT Filed: Jun. 8, 2001

(86) PCT No.: PCT/JP01/04833

§ 371 (c)(1),
(2), (4) Date: Apr. 11, 2003

(87) PCT Pub. No.: WO01/96241

PCT Pub. Date: Dec. 20, 2001

(65) Prior Publication Data

US 2003/0161777 A1     Aug. 28, 2003

(30) Foreign Application Priority Data

Jun. 12, 2000  (JP) .............................. 2000-175299

(51) Int. Cl.
*C01F 17/00* (2006.01)
(52) U.S. Cl. ...................... 423/21.1; 423/263
(58) Field of Classification Search ............... 423/21.1, 423/592.1, 508, 509, 511, 561.1, 263
See application file for complete search history.

(56) References Cited

U.S. PATENT DOCUMENTS

| | | | |
|---|---|---|---|
| 5,006,318 A * | 4/1991 | Demazeau et al. ........ 423/21.1 |
| 5,061,560 A * | 10/1991 | Tajima et al. ................ 428/357 |
| 5,152,973 A * | 10/1992 | Spencer ....................... 505/425 |
| 5,332,558 A * | 7/1994 | Kaneyoshi et al. ........ 423/21.1 |
| 6,533,855 B1 * | 3/2003 | Gaynor et al. .......... 106/287.14 |
| 2002/0051740 A1 | 5/2002 | Konrad et al. |

(Continued)

FOREIGN PATENT DOCUMENTS

| JP | 2004-354927 A | * | 12/2004 |
| WO | WO 94/04459 | * | 3/1994 |
| WO | WO 99/59754 |   | 11/1999 |

OTHER PUBLICATIONS

Tang et al. "Antiferromagnetic Coupling in a Macroscopic Ferrimagnet EuS-Co" IEEE Transactions on Magnetics, vol. 33, No. 5 Sep. 1997, pp. 3739-3741.*

(Continued)

*Primary Examiner*—Timothy C. Vanoy
(74) *Attorney, Agent, or Firm*—Sherman & Associates

(57) ABSTRACT

A crystalline rare-earth oxide or sulfide which has an average particle diameter of 10 nm or less and in which the rare-earth element has a low valance, in particular, crystalline EuO or EuS of nano size. The rare-earth oxide or sulfide is produced by irradiating an inorganic acid salt or organic acid salt of a rare-earth element having a high valence with a light in the range of from UV to visible light in the presence of: a compound which, upon irradiation with the light in the range of from UV to visible light induces a photooxidation-reduction reaction and simultaneously converts the rare-earth ions having a high valence into ions having a low valence; and a cholagen source compound which immediately reacts with the low valence ions to form a cholagen compound.

3 Claims, 5 Drawing Sheets

U.S. PATENT DOCUMENTS

2003/0124043 A1* 7/2003 Yadav et al. ............... 423/263
2003/0215378 A1  11/2003 Zhou et al.
2005/0036938 A1* 2/2005 Hyeon ................... 423/561.1
2006/0014938 A1* 1/2006 Groman et al. ............. 534/15

OTHER PUBLICATIONS

Kusaba et al. "Higher yield of Photoreduction from Eu3+ to Eu2+ with shorter wavelength irradiation" Chemical Physics Letters, vol. 197, Nos. 1, 2, Sep. 4, 1992, pp. 136-140.*

* cited by examiner

RARE-EARTH OXIDE OR SULFIDE OF NANO SIZE AND PROCESS FOR PRODUCING THE SAME THROUGH PHOTOCHEMICAL REACTION

FIELD OF THE INVENTION

The present invention relates to rare-earth oxide or sulfide of nano size and a process for producing the same, in particular, relates to crystalline EuO or EuS of nano size and a method for producing crystalline EuO or EuS of nano size.

BACKGROUND OF THE INVENTION

Oxide, sulfide, selenide or telluride of rare-earth, which is a chalcogen semi conductor, is an important fundamental material used in various fields such as luminescent material, optoelectronics material, photo-magnetic material or magnetic material. Particularly, EuO or EuS which uses low valence Eu (II) (di-valent) are important material as a photo-magnetic material which displays magnetic-optical Faraday effect and Kerr effect.

In the meanwhile, di-valent Eu (II) ion can not exist stable and easily oxidized to tri-valent Eu (III). Therefore, in the ordinary condition, it is not possible to use Eu (II) salt as a material to synthesis EuO. So, conventionally, a thermo structural rearrangement method characterizing to treat Eu metal or Eu (III) salt by high temperature higher than 1000° C. is used for the synthesis of low valence EuO. [edited by Ginya Adachi "Chemistry of rare-earth" Kagaku Dojin, p398 (1999)].

Further, the method to prepare said compound by reacting Eu metal with liquid ammonia (−77° C.) is proposed [D. E. Eastman, F. Holtzberg and S. Methferrel, Phey. Rev. Lett., 23, 5, 226 (1969)]. However, above mentioned methods are belonging to high energy process, further, according to said preparation methods, it is difficult to adjust the particle size of generated Eu (II) semi-conductor. Therefore, the diameter of the finest one among the obtained Eu (II) semi-conductor is several μm, and it is necessary to make the atmosphere temperature to very low temperature (6K) to generate photo-magnetic property.

In general, when the size of a solid particle is minimized to the order of nano meter, the quantum size effect appears. Therefore, the Eu (II) semi-conductor whose particle size is minimized to nano meter is predicted to generate specific property such as hard magnetism, strong luminescent or photo-magneticity at the room temperature. However, up to the present, it is recognized that the preparation of Eu (II) semi-conductor of low valence having above mentioned specific properties is impossible.

While, there is a paper reporting that when an UV-ray (254 nm) is irradiated to Eu (III) ion in methanol, Eu (II) ion can be generated [document: M.Kusaba, N.Nakashima, W. Awamura, Ylzawa and C. Yamanaka, Chem. Phys. Lett., 197.136(1992)].

However, there are no paper reporting the preparation of oxide or sulfide compound of Eu (II) of low valence and nano size, further, there are also no paper reporting the preparation of Eu (II) semi-conductor by ray irradiation utilizing above mentioned photo-chemical reaction.

The object to be dissolved by the present invention is to provide a crystalline particle of (chalcogenide compound of low valence) oxide or sulfide of Eu (II) which generates quantum efficiency, especially to provide stable crystalline particles of nano size having narrow particle size distribution, further to provide a method for producing said crystalline particles.

The inventors of the present invention have carried out earnest study to solve above mentioned object. And, have investigated to apply the phenomenon disclosed in above mentioned document to the production of oxide or sulfide of nano size Eu (II), namely, said phenomenon is that: when an VV-ray shorter than 300 nm, for example, an UV-ray by a fluorescent lamp which radiates ray of 254 nm is irradiated to Eu (III) ion in methanol, Eu (II) ion can be generated. During the study, salts which supply Eu (III) ion, reagents forming the reaction atmosphere such as solvent which generate Eu (II) ion, generated EU (II) ion are investigated, particularly, the preferable combinations of oxygen or sulfur atoms supplying compounds which provide the environment to form oxide or sulfide are investigated.

In above mentioned investigation, various agents mentioned below were used.

1. As the salt to supply said Eu (III) ion, salt of inorganic acid, especially nitrate (6 hydrate) and salt of organic acid such as salts of mono-carboxylic acid, di-carboxylic acid or tri-carboxylic acid are used.
2. As the solvent to form the reaction atmosphere, polar solvent which dissolve above mentioned salts, for example, alcoholic solvent such as methanol or ethanol or ether are used.
3. At the irradiation of light to said reaction system, a compound to generate a radical which makes Eu (III) reduce to Eu (II), such as methanol (in this case methanol also acts as a solvent) or water (e.g. crystal water of inorganic salt) are coexisted and used as an agent. Still more,
4. The oxygen or sulfur supplying compound generated by said reduction which reacts rapidly with Eu (II), for example, urea as the supplying compound of oxygen or thio urea as the supplying compound for sulfur are used as the coexisted agents.

Under said atmospheric condition for reaction, when the light from the ultra violet region to the visible region, for example the light of 200 nm to 1000 m wavelength region is irradiated, EuO or EuS are generated as the very fine particle whose particle size is equal to or smaller than 10 nm, equal to or larger than 4 nm, and having narrow particle size distribution. That is, the object of the present invention is dissolved. As a light source, laser beam can be used, further the light source of longer wavelength region which brings multiphoton excitation can be used as a light source. Furthermore, the compound which indicates photosensitizing effect can be used together with.

DISCLOSURE OF THE INVENTION

The first one of the present invention is the crystalline and low valent rareearth oxide or sulfide whose average particle size is equal to or smaller than 10 nm, equal to or larger than 4 nm. Desirably, the first one of the present invention is the crystalline and di-valent rare-earth oxide or sulfide, wherein said rareearth element is selected from the group consisting of Eu, Gd, Tb, Dy, Ho, Er, Tm, Yb, Ce, Nd and Sm. More desirably, the first on of the present invention is the crystalline and di-valent rareearth oxide or sulfide, wherein the rare-earth element is the di-valent Eu. Further desirably, the first one of the present invention is the crystalline and di-valent rare-earth oxide or sulfide whose average particle size is equal to or smaller than 10 nm, equal to or larger than 4 nm, characterizing a diffraction peak is observed by the electron diffraction pattern of said rare-earth oxide or sulfide.

The second one of the present invention is the method for producing of the crystalline and di-valent rare-earth oxide or sulfide whose average particle size is equal to or smaller than 10 nm, equal to or larger than 4 nm, comprising, under the presence of water or alcohol which causes the photo oxidation-reduction on salt of inorganic acid or organic acid of tri-valent rare-earth by the irradiation of the light from the ultra violet region to the visible region and simultaneously converts the rare-earth ions having tnvalence into ions having di-valence, and oxygen or sulfur supplying compound which forms oxide or sulfide by reacting immediately with said generated di-valent ion. Desirably, the second one of the present invention is the method for producing of divalent rare-earth oxide or sulfide whose average particle size is equal to or smaller than 10 nm, equal to or larger than 4 nm, and crystalline, wherein the salt of inorganic acid of tri-valent is nitrate, the compound which causes photo oxidation-reduction by the irradiation of light from the ultra violet region to the visible region and simultaneously converts the rare-earth ions having tri-valence into ions having di-valence is water or alcohol, oxygen or sulfur supplying compound is urea, thio urea or above mentioned ion generating compound itself. More desirably, the second one of the present invention is the method for producing a crystalline and di-valent EuO or EuS whose average particle size is equal to or smaller than 10 nm, equal to or larger than 4 nm, wherein nitrate of inorganic salt of tri-valence is Eu($NO_3$). $6H_2O$.

BRIEF ILLUSTRATION OF THE DRAWINGS

FIG. 1 shows the generation of EuO whose average particle size is equal to or smaller than 10 nm, equal to or larger than 4 nm, which is generated by generation of Eu (II) by reduction of Eu (III) caused by radical (.$CH_2OH$) generated from methanol and electron $e^-$, said Eu (II) and the supply of oxygen atom accompanied with the decomposition of chalcogen supplying compound urea ($NH_2(C=O)NH_2$) by the irradiation of ray hv from a light source (RS).

The present invention will be illustrated more in detail.

Figure 1:
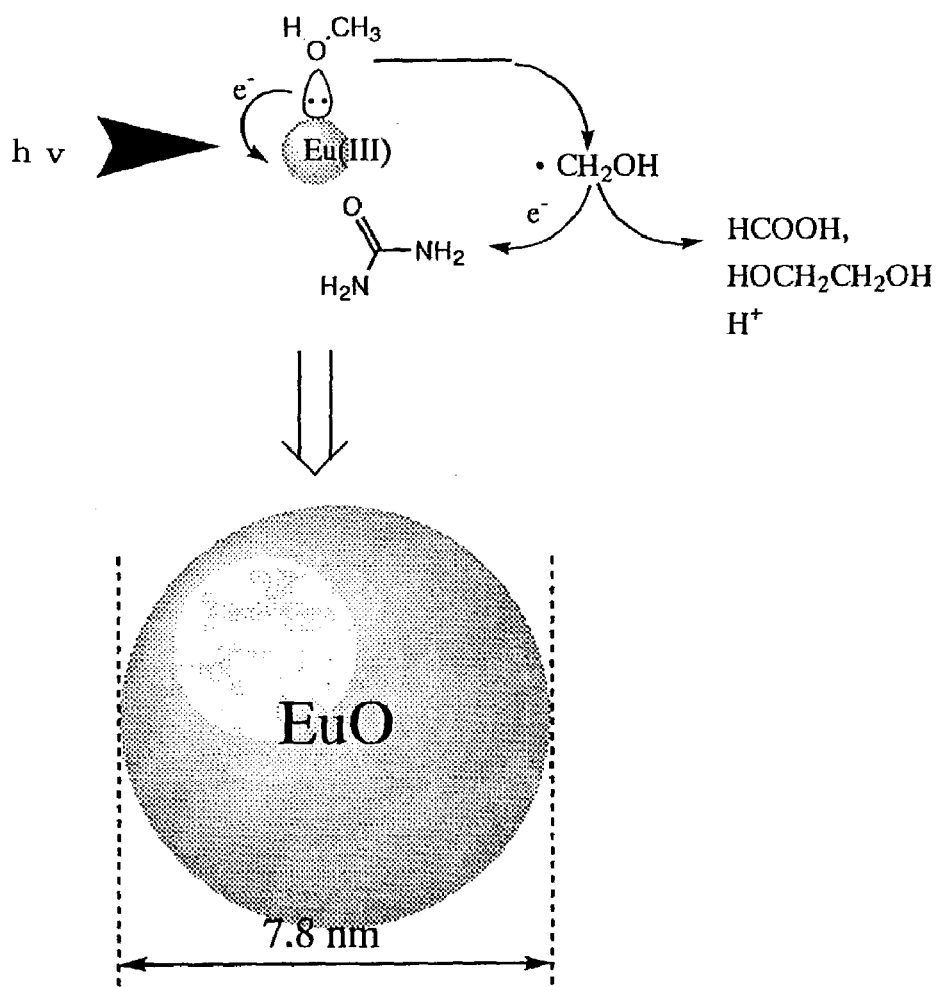
Figure 2:
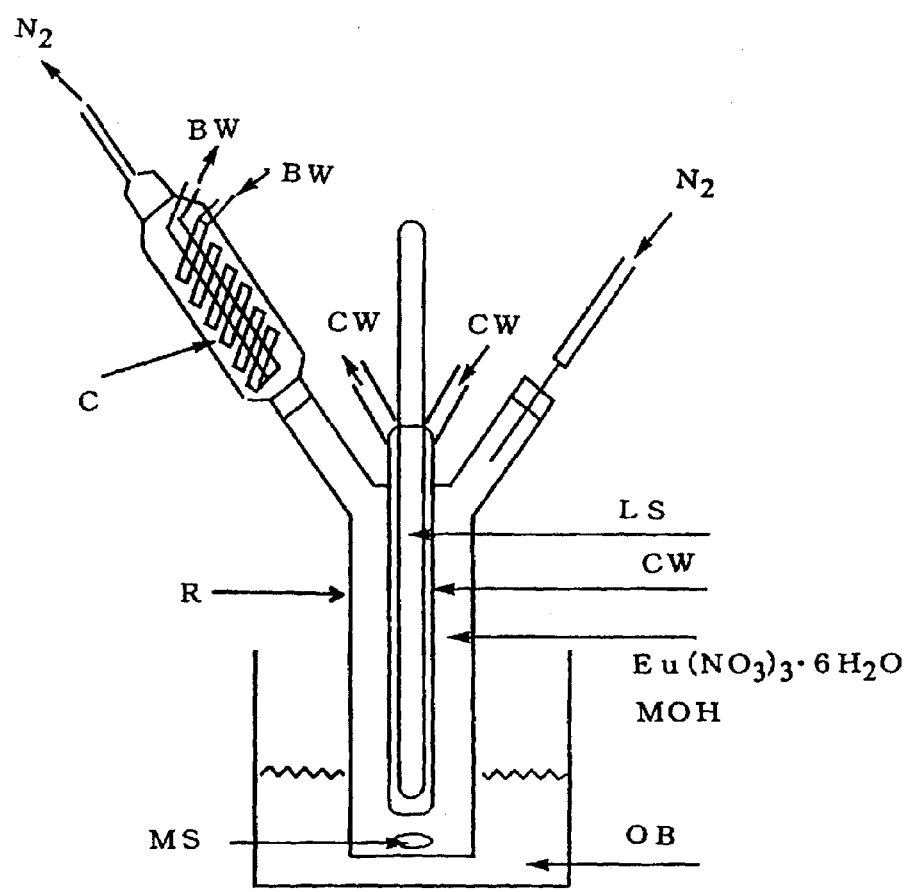
FIG. 2 shows the apparatus for producing relating to the method for producing of FIG. 1 equipping light source (LS, mercury lamp), stirrer (MS), heating bath (oil bath, OB) and condenser (C).

A. The crystalline and low valent rare-earth oxide or sulfide whose average particle size is equal to or smaller than 10 nm, equal to or larger than 4 nm, of the present invention is illustrated referring to FIG. 1, which shows the typical reaction to form EuO. And the apparatus to carry out said reaction is shown in FIG. 2. In FIG. 1, the generation of methanol radical and the electron transfer to Eu (III) by the irradiation of ray hv from an ordinary mercury lamp (RS) which generate the ray of wavelength λ=254 nm, which is shorter than 300 nm, is shown. Concretely, the generation of Eu (II) by reducing Eu (III) caused by the electron transferring at the forming of the charge-transfer complex of methanol radical and EU (III), then the generation of the crystalline and low valent rare-earth oxide or sulfide whose average particle size is equal to or smaller that 10 nm, equal to or larger than 4 nm, for example, crystalline EuO or EuS whose average particle size is equal to or smaller than 10 nm, equal to or larger than 4 nm, by the reaction of said Eu (II) with oxygen or sulfur supplying compound e.g. urea or thiourea is shown in FIG. 1.

In a reacting vessel (R) made of quartz shown in FIG. 2, the space in which a light source (LS) to supply the ray of reacting wavelength, in this example, a mercury lamp which generates UV ray of 254 wavelength enable to circulate cooling water is provided. The reacting vessel (R) has also the spaces to store inorganic salt of rare-earth e.g. Eu($NO_3$)$_3$, compound which is the solvent of said inorganic salt and generates above mentioned radical which forms the charge-transfer complex at the photochemical reaction and an electron e.g. methanol and the oxygen or sulfur supplying compound e.g. urea. Further, the reacting vessel has a stirrer to stir said reacting solvent. Said reacting vessel is contained in a heating apparatus e.g. an oil bath (OB) and can progress said photochemical reaction by heatingand refluxing the reacting solvent. During the reaction, an inert gas, for example, $N_2$ gas is flown in the reacting space, and at the outlet of said reacting vessel a condenser with a jacket for cooling medium (BM) which cools solvent and refluxes to the reacting vessel is equipped.

B. Reagents to be used in said reaction system are shown
1. The rare-earth atoms forming rare-earth salts which are used as a starting material are not restricted, however, Eu, Gd, Tb, Dy, Ho, Er, Tm, Yb, Ce, Pr, Nd or Sm can be mentioned as the desirable example. Especially, Eu can be mentioned as the more desirable example.
2. As the acid to form said salt, inorganic acid such as nitric acid or sulfuric acid and monocarboxylic acid such as acetic acid, di-carboxylic acid such as oxalic acid, succinic acid or malonic acid or tri-carboxylic acid such as citric acid can be used. Especially, the use as nitrate 6 hydrate or acetate are desirable.
3. As the solvent, protic solvent such as water or alcohol e.g. methanol or ethanol or non protic solvent such as ether can be used. Methanol is not only a desirable solvent but also can be used as a compound to generate a radical and an electron by the radiation of Uv-visible ray which cause the reaction. When the nitrate with crystal water is used the generation of EuO is effectively caused, and from this phenomenon it is considered that water takes part in the generation of EuO.
4. As the oxygen or sulfur supplying compound, urea, thiourea, dithiolane, thioacetoamide, hydrogen sulfide, sodium sulfide or potassium sulfide can be mentioned. Urea, thiourea, dithiolane and thioacetoamide are the desirable compounds. That is, the compound which can supply oxygen or sulfur atom to Eu (II) by decomposition in the photochemical reaction system can be used.

C. As the light source to be used for the reaction, the light which radiate the ray of UV wavelength to visible region (wavelength 200 nm–1000 nm) can be used, and it depends to the characteristics of the compound used to the generation of a radical. As the desirable one, the light source which radiates the ray of 250 nm to 500 nm wavelength can be mentioned. Especially, a mercury lamp which radiates an ultra violet ray (254 nm) is more desirable.

D. As the reaction temperature, the temperature from −30° C. to 300° C. is preferably applied, however, the temperature from 0° C. to 200° C. is desirable.

E. The ray radiation condition is at least 1 nano second.

EXAMPLE 1

$Eu(NO_3)_3 \cdot 6H_2O$ (30 mmol) and urea (90 mmol) are dissolved into 400 mL of methanol and removed oxygen by nitrogen for 30 minutes. Ray is radiated to the solution using a mercury lamp of 500 W which radiates 254 nm ray for 3 days. The obtained solution is centrifuged under the condition of 6000 R/M for 15 minutes and EuO solid of nano size is separated from liquid. The obtained solid is dispersed into methanol and rinsed, then the liquid is removed by a centrifuge. Thus the refined solid is obtained.

Characteristics of the obtained nano size EuO solid.

Figure 3:
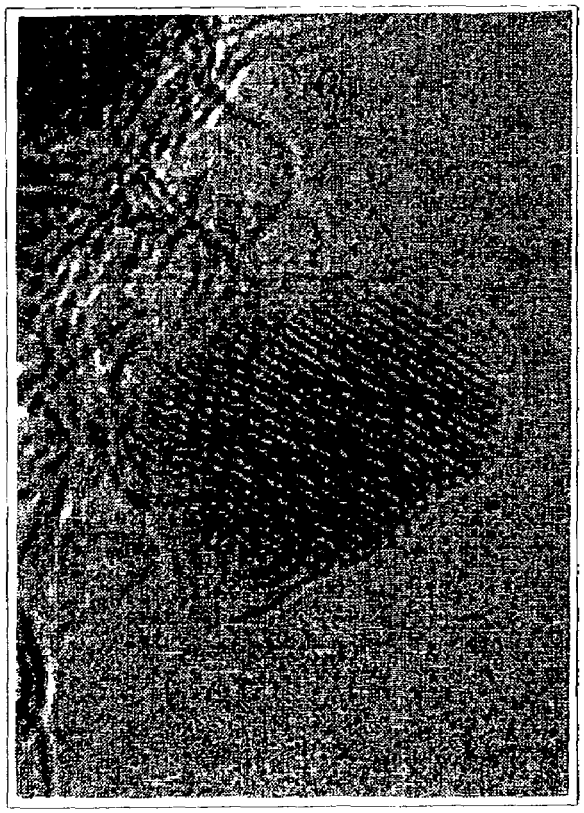
FIG. 3 is the image of transmission electron microscope (picture) of the obtained nano size EuO.
Figure 4:
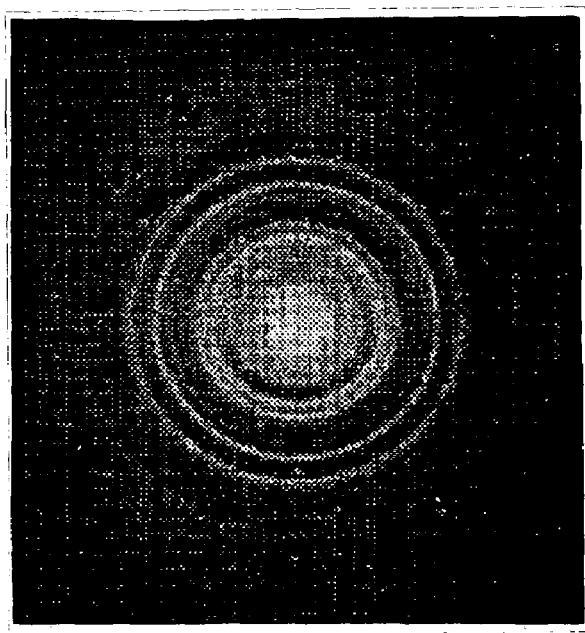
FIG. 4 is the electron diffraction pattern of the obtained nano size EuO.
Figure 5:
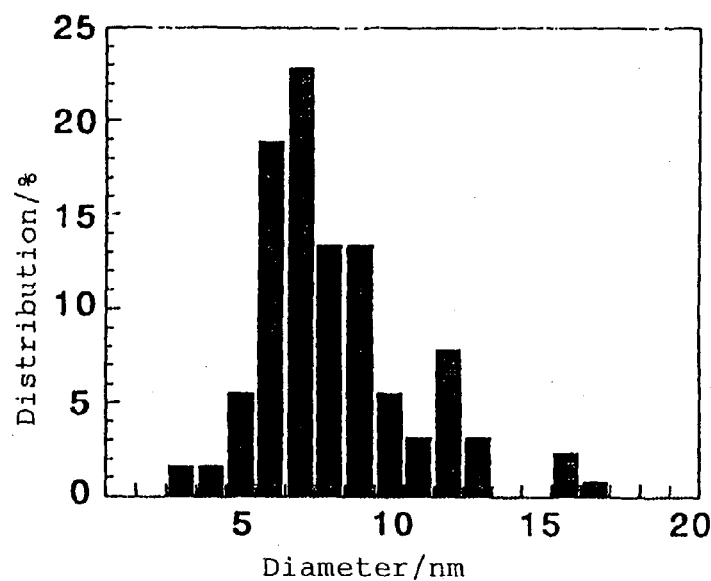
FIG. 5 shows the particle size distribution of 253 specimens of the obtained nano size EuO particles.
Figure 6:
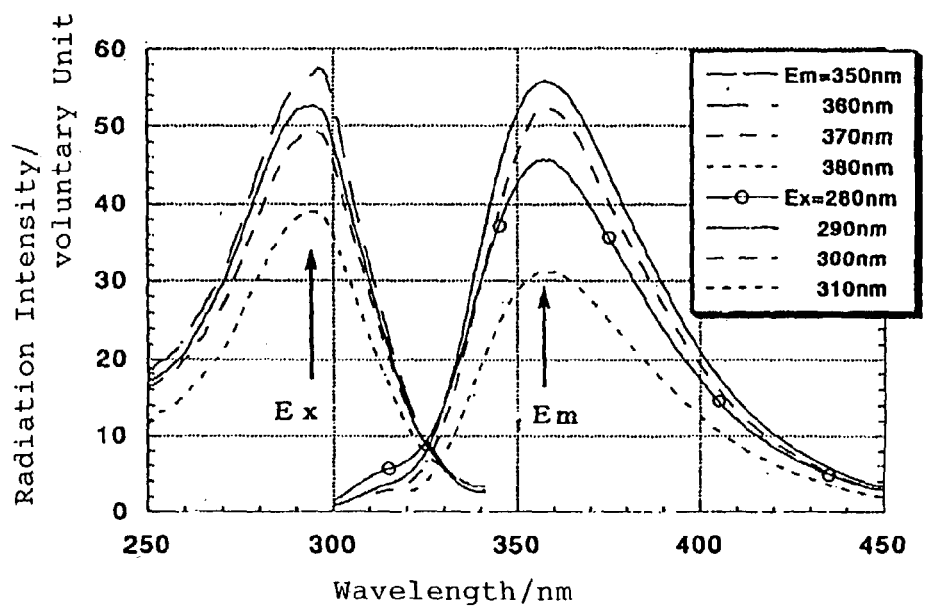
FIG. 6 shows the excitation-fluorescent characteristic of the obtained nano size EuO.

1. In the picture (FIG. 3) of transmission electron microscope (TEM), a clear interference fringe is observed, which indicates that the EuO solid has a crystalline structure. FIG. 4 is the electron diffraction pattern.
2. 253 specimens are picked up from the pictures of transmission electron microscope and the diameter of these specimens are measured. The particle size distribution of the generated nano size particles are investigated. The result is shown in FIG. 5.
3. The relationship between wavelength (nm) and emission intensity (voluntary unit) which shows excitation spectrum (Ex)—excitation of emission spectrum (Em) characteristic of the obtained nano size EuO is shown in FIG. 6. Since there is a fluorescent peak at 370 nm, it has a possibility for the application as the ray source of laser.

Figure 7:
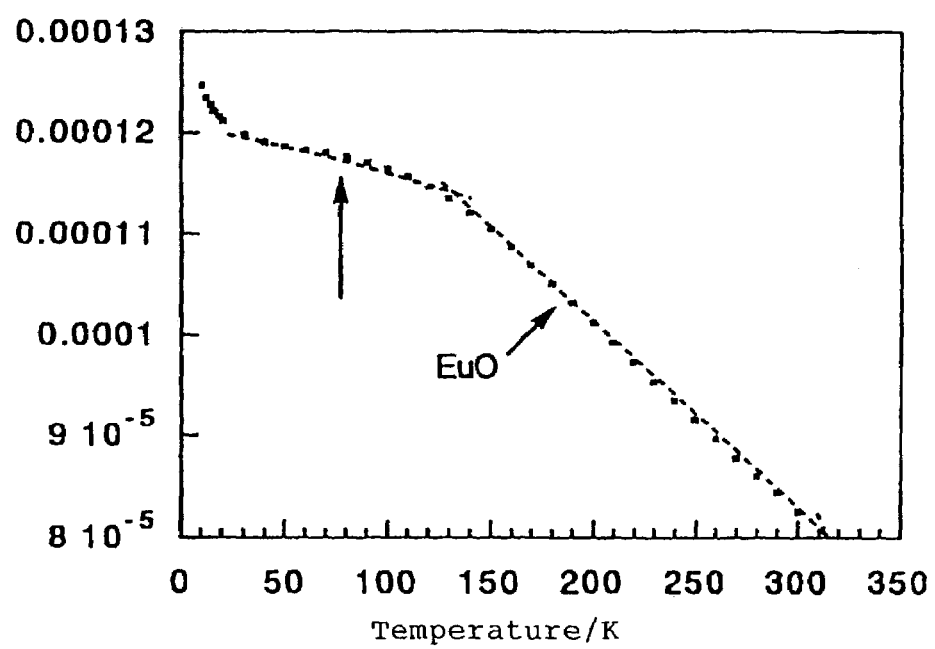
FIG. 7 shows the magnetic characteristic of the obtained nano size EuO.

FIG. 7 is the magnetic characteristic of the obtained nano size EuO.

INDUSTRIAL APPLICABILITY

As mentioned above, the possibility for producing of nano size fine particles having narrow distribution is confirmed in the present invention, and the quantum size effect along with ultra fine granulation is displayed. Obviously from the magnetic characteristic, changes of various characteristics can be expected. Therefore, the uses as a photo magnetic disk, a photo isolator, a photo shutter, a laser and a semiconductor unit can be expected in the future. That is, the present invention brings excellent effects.

The invention claimed is:

1. A method for producing a crystalline oxide of di-valent Eu having an average particle size x in nm as provided by the following equation 4 nm$\leq$x$\leq$10 nm comprising the steps of, photo oxidation-reduction of an inorganic acid salt of tri-valent Eu in the presence of water or alcohol
  by the irradiation of light from the ultra violet region to the visible region and converting tri-valent Eu ions into divalent Eu ions and
  reacting said divalent Eu ions with a compound supplying oxygen to form an oxide.

2. The method for producing a crystalline oxide of di-valent Eu having an average particle size x in nm as provided by the following equation 4 nm$\leq$x$\leq$10 nm of claim 1,
  wherein the inorganic salt of tri-valent Eu is nitrate, and wherein said compound supplying oxygen is urea.

3. The method for producing crystalline oxide of divalent Eu of claim 1, wherein said inorganic salt of tri-valent Eu is $Eu(NO_3)_3 \cdot 6H_2O$.

* * * * *